US012637758B2

(12) United States Patent
  Borodin

(10) Patent No.: US 12,637,758 B2
(45) Date of Patent: May 26, 2026

(54) COATING CHAMBER WITH DISTANCE DETECTION FOR THE SUBSTRATES

(71) Applicant: SINGULUS TECHNOLOGIES AG, Kahl am Main (DE)

(72) Inventor: Sergiy Borodin, Aschaffenburg (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 0 days.

(21) Appl. No.: 18/728,824

(22) PCT Filed: Nov. 22, 2022

(86) PCT No.: PCT/EP2022/082807
  § 371 (c)(1),
  (2) Date: Jul. 12, 2024

(87) PCT Pub. No.: WO2023/143772
  PCT Pub. Date: Aug. 3, 2023

(65) Prior Publication Data
  US 2025/0075311 A1  Mar. 6, 2025

(30) Foreign Application Priority Data
  Jan. 27, 2022  (DE) .................... 10 2022 200 914.2

(51) Int. Cl.
  *C23C 14/50* (2006.01)
  *C23C 14/24* (2006.01)
  (Continued)

(52) U.S. Cl.
  CPC .............. *C23C 14/52* (2013.01); *C23C 14/24* (2013.01); *C23C 14/56* (2013.01)

(58) Field of Classification Search
  CPC ......... C23C 14/52; C23C 14/24; C23C 14/56; C23C 16/54; C23C 16/45551;
  (Continued)

(56) References Cited

U.S. PATENT DOCUMENTS 8,189,198 B2 * 5/2012 Black ................... H01L 21/6719
                                         356/429
9,151,597 B2 * 10/2015 Milliron ............ H01L 21/67259
  (Continued)

FOREIGN PATENT DOCUMENTS

CN      208898988 U    5/2019
DE   102012004505 B3    4/2013
  (Continued)

OTHER PUBLICATIONS

Kestner J M et al, "An experimental and modeling analysis of vapor transport deposition of cadmium telluride", Solar Energy Materials and Solar Cells, Elsevier Science Publishers, Amsterdam, NL, (Jun. 1, 2004), vol. 83, No. 1, doi:10.1016/J.SOLMAT.2004.02.013, ISSN 0927-0248, pp. 55-65.
  (Continued)

*Primary Examiner* — Rudy Zervigon
(74) *Attorney, Agent, or Firm* — Branch Partners PLLC; Bruce E. Black

(57) ABSTRACT

The present invention relates to a coating plant and a method for coating substrates with distance detection for the substrates.

21 Claims, 2 Drawing Sheets

Figure 1:
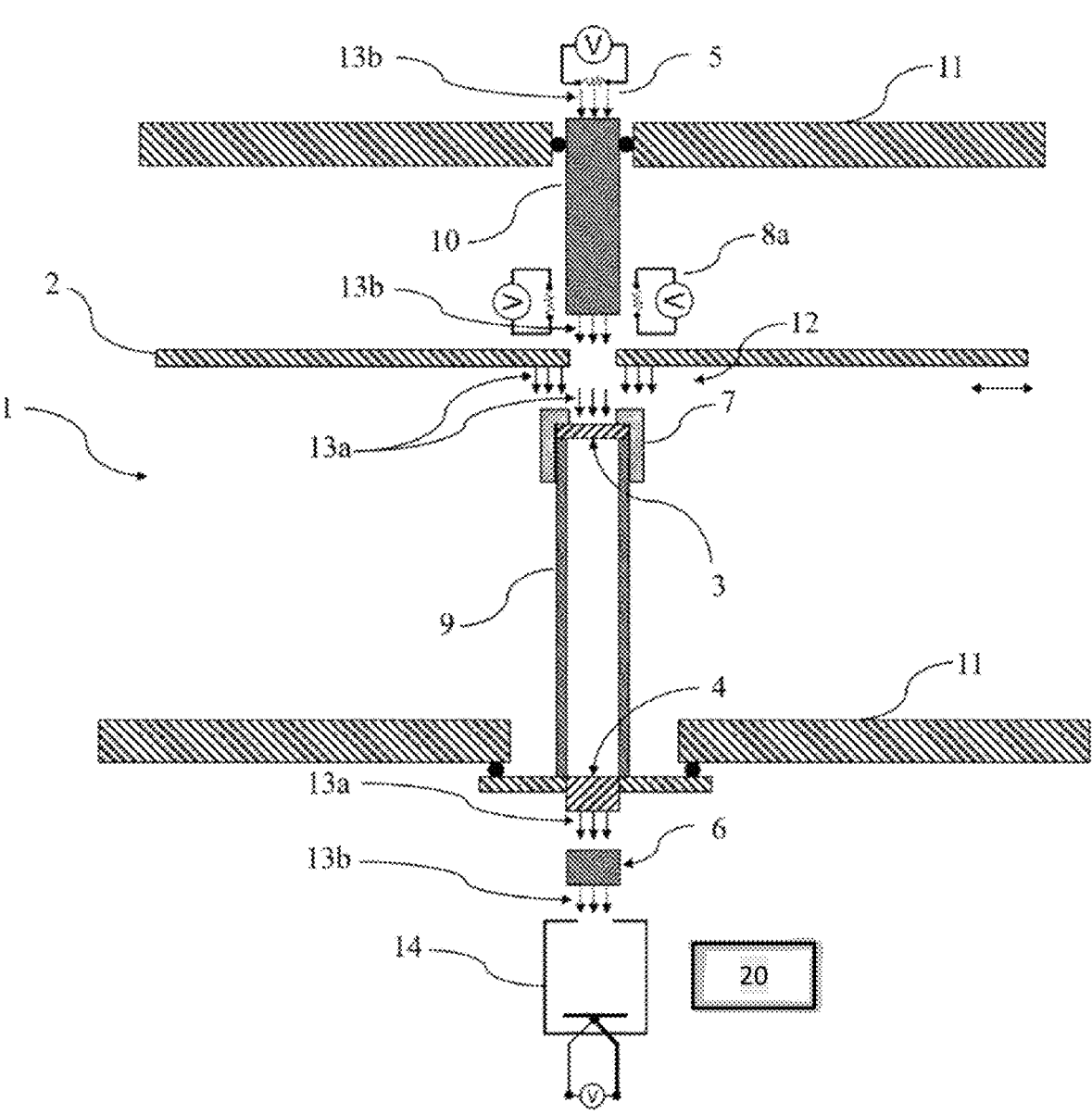

(51) Int. Cl.
    *C23C 14/52*       (2006.01)
    *C23C 14/56*       (2006.01)

(58) Field of Classification Search
    CPC . C23C 16/545; C23C 16/4412; C23C 14/568;
             C23C 16/4401; H01L 21/67259; H01L
             21/6776; H01L 21/6719; H01L 21/67196;
             H01L 21/67201; H01L 21/67173; H01L
             21/67184; H01L 21/67161; H01L
             21/67155; H01L 21/67017; H01L
             21/67069; H01L 21/67748; H01L
             21/67751; H01L 21/67745; G01B 11/026
    USPC ........................ 118/719, 663, 665, 668, 688;
             156/345.31, 345.32, 345.24, 345.25,
             156/345.26, 345.27, 345.28
    See application file for complete search history.

(56)           References Cited

U.S. PATENT DOCUMENTS

| | | | |
|---|---|---|---|
| 2004/0232920 A1* | 11/2004 | Strang | G01B 15/02 |
| | | | 438/100 |
| 2011/0046916 A1 | 2/2011 | Yu et al. | |
| 2011/0165315 A1* | 7/2011 | Beck | C23C 14/544 |
| | | | 118/712 |
| 2012/0064657 A1* | 3/2012 | Pepler | H01L 21/67173 |
| | | | 118/668 |
| 2013/0206065 A1* | 8/2013 | Milliron | H01L 21/67248 |
| | | | 118/712 |
| 2014/0093985 A1* | 4/2014 | Li | G01N 21/211 |
| | | | 118/712 |
| 2015/0079271 A1* | 3/2015 | Hermanns | C23C 16/545 |
| | | | 427/580 |
| 2017/0051403 A1* | 2/2017 | Yonezawa | C23C 16/46 |
| 2023/0217839 A1* | 7/2023 | Khandan | C23C 16/458 |
| | | | 118/712 |
| 2023/0290644 A1* | 9/2023 | Nishihara | H01L 21/31116 |
| 2025/0075311 A1* | 3/2025 | Borodin | H01L 21/67259 |
| 2025/0188589 A1* | 6/2025 | Borodin | C23C 16/448 |

FOREIGN PATENT DOCUMENTS

| | | |
|---|---|---|
| DE | 102013106788 A1 | 12/2014 |
| DE | 102014107638 A1 | 12/2015 |
| WO | WO2019104648 A1 | 6/2019 |

OTHER PUBLICATIONS

International Search Report and Written Opinion for PCT Application No. PCT/EP2022/082807 mailed Feb. 23, 2023 (Original and translation).

International Preliminary Report on Patentability for PCT Application No. PCT/EP2022/082807 mailed Oct. 9, 2023 (Original and translation).

* cited by examiner

COATING CHAMBER WITH DISTANCE DETECTION FOR THE SUBSTRATES

CROSS-REFERENCE TO RELATED APPLICATIONS

This present application is a U.S. national stage application of PCT Application No. PCT/EP2022/082807, filed Nov. 22, 2022, which claims priority to German Patent Application No. 10 2022 200 914.2, filed Jan. 27, 2022, both of which are hereby incorporated by reference in their entirety.

The present invention relates to a coating chamber and a method for coating substrates with detection of the distance between the substrates.

In a wide variety of coating processes, a large number of substrates are coated in a so-called in-line process under vacuum. The substrates to be coated are moved in the coating plant before, during and/or after coating. During this movement, the distance between the substrates should be set as precisely as possible to ensure controlled movement of the substrates through the coating plant.

Many optical sensors already available on the market (e.g., Baumer GmbH sensors with a wavelength of 656 nm), which are used to measure the position of substrates, require a display window. This display window is usually located in the coating area, which means that the display window is also coated during the coating of the substrates and becomes opaque to the typical radiation detected by the sensors within a short time. To avoid this problem, the transport system is usually technically designed in such a, cost-intensive, way that the substrates are transported through the coating area at the distance set before the coating area without further positioning detection. In the case of hot substrates and coating materials with a high absorption temperature, such as CdTe at over 500° C. in a vacuum, the thermal expansion of the glass substrate and the change in the transport roller diameter due to deposition of the coating play a decisive role. Under such conditions, the distance between the substrates in front of the coating area has so far been set generously, which has a detrimental effect on evaporation efficiency. Alternatively, the display windows are heated to a high temperature depending on the absorption temperature of the coating material, e.g., to over 320° C. in the case of coating with selenium.

In WO 2019/104648 A1, it was proposed to indirectly measure the position of the substrates via the torque on the drives. An example of position detection of a substrate by means of optical detection through a display window is described in DE 10 2014 107 638 A1. CN 2 08 898 988 U and DE 10 2013 106 788 A1 also address the issue of position detection in the context of coating plants.

Against this background, it is an object of the present invention to provide an improved coating chamber for coating substrates (or a corresponding coating method) which enables a simple, safe/reliable manner requiring only low maintenance of detecting the distance between substrates in the coating chamber.

This object is achieved by a coating chamber or a method according to the independent claims. Preferred embodiments of the present invention are described in more detail in the dependent claims.

Accordingly, the present invention is directed to a coating chamber for coating substrates, the coating chamber having at least a first chamber wall and a coating area through which successive substrates to be coated are conveyed. The first chamber wall comprises a gas-tight unit with a first window for infrared radiation (IR radiation) and a second window for IR radiation. The coating chamber further comprises a detector for IR radiation, which is arranged in such a way that IR radiation from the coating area can impinge on the detector through the windows of the gas-tight unit. The coating chamber further comprises a processor which is adapted and configured to determine the distance between two successive substrates to be coated on the basis of the IR radiation detected by the detector.

The invention is based, among other things, on using the gas-tight unit comprising two windows for IR radiation to allow only IR radiation from a very limited area to impinge on the detector. The first window forms a "hot" window within the coating area so that as little coating material as possible can deposit/precipitate on it. Accordingly, the temperature gradient to the second, "cold" window extends along the gas-tight unit. Measurement by means of IR radiation also enables stable detection of the substrates even if the first window is covered with coating material, since the typical coating materials (e.g., CdS, CdSe, CdTe, PbI2, CsI) have a relatively wide transmission window in the IR range.

In the context of the present invention, the coating area also includes the immediate vicinity of the actual substrate position in which coating takes place. In fact, the gas-tight unit or its window should be arranged so that the detector does not face the coating source (e.g., a PVD source with directed material emission).

In the context of the present invention, the distance between the successive substrates to be coated is detected by means of IR radiation, with the determination of the distance being based primarily on a difference in IR radiation intensity between the substrates on the one hand and the surroundings (e.g., chamber wall) on the other hand. The invention works both in the case when the substrates are hotter than the surroundings and in the opposite case when the surroundings are hotter than the substrates.

The first window of the gas-tight unit preferably closes the first chamber wall in a vacuum-tight manner. In particular, the first chamber wall can comprise an opening that is closed in a gas-tight manner by the first window.

The second window of the gas-tight unit is preferably arranged inside the coating chamber between the coating area and the first window. Preferably, the first window and the second window are connected to each other via a tubular element, the interior of which is separated from the coating chamber in a gas-tight manner. The tubular element can be a cylindrical element, in particular a circular cylindrical element. However, other tubular elements are also conceivable as long as they create a visual axis from the first window to the second window. The gas-tight unit is intended, in particular, to prevent vaporized coating material from entering the interior of the tubular element by means of the gas-tight separation from the coating chamber. In the context of the present invention, a gas-tight unit is to be understood as a unit in which the flow of material from the coating chamber into the interior of the unit is largely based on a molecular flow.

The tubular element is preferably made of a material the thermal conductivity of which is at most 50 W/m·K, more preferably at most 30 W/m·K and particularly preferably at most 5 W/m·K. Graphite or CFC are particularly suitable materials for the tubular element. The low thermal conductivity of the tubular element is to ensure that the second window is not heated too much.

Preferably, the inner side or inner surface of the tubular element has a mean reflection coefficient of at most 50%, more preferably at most 30% and particularly preferably at most 10% over the wavelength range of 0.3 μm-6.0 μm. This is to prevent scattered IR radiation from other areas within the coating chamber from being transported to the detector and interfering with the optical signal from the coating area.

With regard to good imaging, it is further preferred that the distance between the second window and the substrates to be imaged or detected is as small as possible. For this purpose, it is preferred that the second window has a free opening area on which an internal diameter can be inscribed and that the distance between the second window and the plane defined by the successive substrates is at most five times the internal diameter, more preferably at most twice the internal diameter and particularly preferably at most the internal diameter.

With regard to good imageability, it is also preferred that the tubular element is as long as possible. In particular, the ratio between the distance between the two windows on the one hand and the internal diameter on the other hand is at least two, more preferably at least four and particularly preferably at least ten.

The first and second windows define an optical axis which preferably forms an angle of between 80° and 100° with the plane defined by the successive substrates. The optical axis is preferably aligned perpendicularly to this plane.

The first window and/or the second window preferably has a mean transmission of at least 10%, more preferably of at least 30% and particularly preferably of at least 80% over the wavelength range of 0.3 μm-5.0 μm. Preferably, the detector is sensitive to IR radiation at least in this wavelength range of 0.3 μm-5.0 μm.

As already explained, the detection of the signal difference between the situation in which a substrate is situated in the visual axis of the two windows on the one hand, and the situation in which the detector detects the IR radiation emitted by the surroundings on the other hand, makes it possible to determine the substrate distance. This requires that the IR spectrum emitted by the substrates and the IR spectrum emitted by the surroundings differ. If this is not the case, different spectra can be achieved by providing an additional IR radiation source. It is therefore preferable that the coating chamber has an IR radiation source, preferably an IR spot heating source, which is arranged in such a way that IR radiation from the IR radiation source can impinge on the detector through the coating area and through the windows of the gas-tight unit. If there is no substrate in the coating area, the detector will primarily detect the IR radiation emitted by the IR radiation source. However, if a substrate is present in the coating area, the IR radiation emitted by the IR radiation source is (partially) blocked so that a different signal is measured at the detector. In particular, the signal measured at the detector will depend on the distance between two successive substrates, as more or less of the IR radiation emitted by the IR radiation source is blocked depending on this distance.

Alternatively, the coating chamber can also comprise a second chamber wall opposite the first chamber wall, which comprises an IR radiation source arranged in such a way that IR radiation from the IR radiation source can impinge on the detector through the coating area and through the windows of the gas-tight unit. Preferably, an optical element is provided between the IR radiation source and the coating area. Said optical element preferably has a transmission of at least 10%, more preferably of at least 30% and particularly preferably of at least 80% for the maximum of the IR radiation emitted by the IR radiation source. Preferably, the optical element is also made of a material whose thermal conductivity is at most 10 W/m·K, more preferably at most 5 W/m·K and particularly preferably at most 1 W/m·K. The optical element is particularly preferably made of quartz glass. Furthermore, a heater can be provided to heat the end of the optical element facing the coating area.

It is preferable that an IR radiation filter is provided between the first window and the detector, which has a maximum transmission for the wavelength that corresponds to the emission peak of the IR radiation source. This can further improve the signal-to-noise ratio.

The present invention further relates to a method of coating substrates using a coating chamber as described above. The method comprises conveying successive substrates to be coated through the coating area of the coating chamber and coating the substrates. Furthermore, as part of the method, the IR radiation impinging on the detector is detected and the distance between two successive substrates to be coated is determined on the basis of the detected IR radiation.

Preferably, the method further comprises the step of calibrating the amount of IR radiation incident on the detector to a state in which only IR radiation emitted from a substrate is detected.

Preferably, the method further comprises the step of calibrating the amount of IR radiation incident on the detector to a state in which no IR radiation emitted from a substrate is detected.

Preferably, the method further comprises the step of calibrating the amount of IR radiation incident on the detector to one or more states in which two successive substrates have one or more well-defined distances. For example, if the distance between two consecutive substrates during coating is ideally 20 mm, it may be useful to determine in advance the amount of IR radiation that impinges on the detector when the distance is 10 mm, 15 mm, 20 mm, 25 mm and 30 mm. These measuring points can be used to interpolate a radiation quantity versus distance in the range between 10 mm and 30 mm, which in turn can be used to infer the actual distance during coating when the IR radiation incident on the detector is detected.

Preferably, the substrates emit IR radiation with a maximum intensity at a first wavelength, wherein the first window and/or the second window at the first wavelength has a transmission of at least 10%, more preferably of at least 30% and particularly preferably of at least 80%.

It is further preferred that the coating chamber comprises an IR radiation filter between the first window and the detector, wherein the IR radiation filter has a maximum transmission for the first wavelength.

In the context of the coating chamber according to the invention and the coating process according to the invention, the distance between successive substrates can be measured in a simple and relatively error-free manner. A position of the substrates in the coating area can also be determined with the present invention, which is generally not possible with typical optical sensors. Using the position information of the substrates in the coating area, the transport system can be controlled directly in a closed control loop to achieve a constant substrate flow. The transport system, which is permanently controlled to the current substrate position, can be designed to be technically uncomplicated, as it also tolerates, for example, play in the belts, chains, gearwheels and drives as well as a change in the belt length over time. In particular, the present invention can be used to respond to a length expansion of large substrates as a function of temperature (e.g., a few millimeters for a substrate length of 2 m and a temperature difference of 300 K). In situations where the substrate flow comes to a standstill and has to be restarted, the system start-up procedure can be defined and executed in a traceable manner. The detected and, depending on the situation, optimally adjusted distance between successive substrates prevents both glass breakage due to substrate collision and unnecessary loss of material on the substrate.

Figure 2:
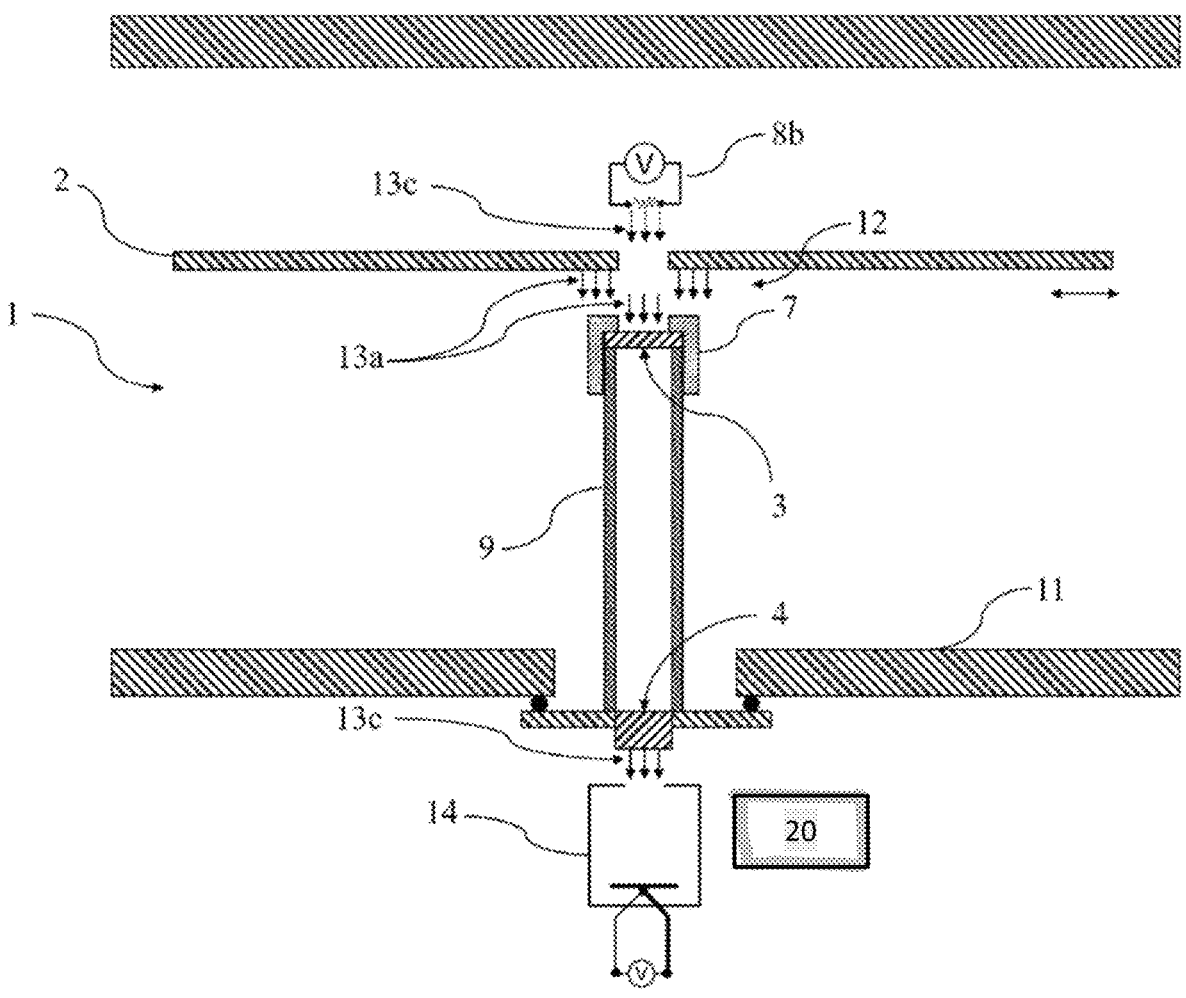

In the following, preferred embodiments of the present invention are described in more detail with reference to the Figures. The Figures show:

FIG. 1 a schematic sectional view through a coating chamber according to a preferred embodiment of the present invention; and FIG. 2 a schematic sectional view through a coating chamber according to a further preferred embodiment of the present invention.

FIG. 1 shows a schematic sectional view of a coating chamber 1 for coating substrates 2 according to a preferred embodiment of the present invention. The coating chamber 1, of which only two chamber walls 11 are shown herein, can be part of a larger coating plant and can comprise the usual components, for example for evacuating the coating chamber, for transporting the substrates 2 and for coating the substrates 2, all of which are not shown for the sake of simplicity. In the preferred embodiment shown, the substrates 2 to be coated move in a plane defined by these substrates, which extend perpendicularly to the plane of the drawing, along the double arrow shown on the right-hand margin of the Figure. The substrates 2 can be coated from above and/or below in the coating area 12 of the coating chamber 1 using coating units not shown.

According to the invention, the coating chamber 1 for coating substrates 2 comprises at least a first (here: the lower) chamber wall 11 and a coating area 12. Successive substrates 2 to be coated, which are at a distance from one another that is to be determined, are conveyed through the coating area 12. The first (here: lower) chamber wall 11 has a gas-tight unit with a first window 4 for IR radiation and a second window 3 for IR radiation. Further, a detector 14 for IR radiation is provided, which is arranged in such a way that IR radiation from the coating area can impinge on the detector 14 through the windows 3 and 4 of the gas-tight unit. The coating chamber further comprises a processor 20 which is adapted and configured to determine the distance between two successive substrates 2 to be coated on the basis of the IR radiation detected by the detector 14.

The first window 4 preferably closes the first chamber wall 11 in a vacuum-tight manner, in the preferred embodiment shown by means of a vacuum flange in which a sapphire window 4 is mounted. The second window 3 of the gas-tight unit is arranged inside the coating chamber 1 between the coating area 12 and the first window 4, so that a visual axis from the coating area 12, in which the substrates 2 are coated, through the two windows 3 and 4 to the detector 14 is obtained. The two windows 3 and 4 are connected to each other via a tubular element 9, the interior of which is separated from the coating chamber 1 in a gas-tight manner, and together they form the gas-tight unit. The window 3 can optionally be connected to the tube 9 by means of a connecting element 7. This makes it possible to connect windows of different materials and/or different sizes to the tube 9.

As can easily be seen from FIG. 1, the detector 14 detects infrared radiation 13a through the two windows 3 and 4, which is emitted by the substrates 2 and/or the opposite chamber wall 11. In the situation shown in FIG. 1, essentially, only infrared radiation 13a from the surroundings, i.e. in particular from the opposite chamber wall 11, is detected.

In the case of a smaller distance between the successive substrates 2, the detector 14 would detect infrared radiation 13a from the opposite chamber wall 11 as well as from one or both of the successive substrates 2 (depending on their position). If the substrates 2 are hotter than the opposite chamber wall 11, the intensity and/or spectral distribution detected by the detector 14 will depend on the size of the gap or the distance between the two successive substrates 2. Thus, the distance between the substrates can be deduced from the detected IR radiation.

A particularly preferred embodiment is described in more detail below.

In a preferred example according to FIG. 1, an $Al_2O_3$ window 4 (e.g.: 120GSG016-saphir from Pfeiffer Vacuum GmbH) is inserted in a vacuum flange on the chamber wall 11. Above this sapphire window 4 is another sapphire window 3. The two sapphire windows have the typical high transmission of between approx. 0.3 μm-5 μm. There is a tube 9 between the two windows, which dissipates as little heat as possible from window 3 to the flange of window 4 and thus protects the inner area between the two windows from the ambient radiation. The tube 9 can be made of thin CFC or graphite, for example. The inner surface of the tube 9 is intended to prevent the reflection of radiation through absorption. The window 3 is connected to the tube 9 in a radiation-tight manner by the connecting element 7 (e.g., made of graphite). The parts 9 and 7 can also have a coarse thread for screwing.

The connecting element 7 geometrically defines the minimum measurable substrate-to-substrate distance with the opening. If this opening has a diameter a, the distance between the window 3 and the substrates is typically in the interval between a and 3a. The substrate radiates the energy in the range<5 μm at temperatures above approx. 300° C. The energy peak of the 600° C. hot substrate according to Wien's approximation is approx. 3.3 μm. This means that the radiation 13a from the 300° C.-600° C. hot substrates is guided directly out of the coating area 12 through the two sapphire windows, without reflection from the inner surface of the tube 9. This radiation from the substrate can be measured outside the chamber, e.g., using a pyrometer or a detector for the pyrometer application (pyroelectric sensors, thermopiles made of thermocouples, photodiodes, etc.). For example, the PYROSPOT DA 44M with a spectral range of 3 μm to 5 μm (available from DIAS Infrared GmbH) or other pyrometers without radiation filters can be used as the pure detector.

The signal can be normalized in relation to the substrate radiation. The signal to be processed will correspond to the signal drop from the normalized level down to the relative level of the environment. A negative signal corresponds to the gap between the substrates. For substrate-to-substrate distances>a, the signal can be set between two levels:

max.—a substrate is located above the opening in the part 7 min.—no substrate is above the opening in the part 7.

With the substrate-substrate distances in the interval 0-a, the radiation intensity signal can be broken down into further steps depending on the desired minimum unit, e.g., according to the distance between the substrates corresponding to almost zero, a/4, a/2, 3a/4, etc.

Since the detected radiation 13a is in the range of the narrowest transmission window 0.8 μm-18 μm of the coating materials CdS/CdSe/CdTe, the coating will reduce the absolute signal by a maximum of the multiplication of the transmission coefficients of all elements with an optical effect, depending on the thickness (e.g., 0.7*0.7*0.7=0.343), i.e. the absolute signal measured through the coated window 3 will be approx. three times smaller than the original normalized signal through the uncoated window 3. It therefore makes sense to replace the sapphire windows or to clean or mechanically polish the coating material clean by means of a chemical reaction. The sapphire window can easily be replaced during normal maintenance work.

As already explained, the detection method described above is based on different IR emission spectra of the substrates 2 on the one hand and the opposite chamber wall 11 on the other hand. However, if the substrates 2 result in a similar IR signal as the surroundings, a corresponding spectral difference or a corresponding optical contrast/difference can be generated, depending on the detector 14 used, by arranging an additional IR radiation source 5 in such a way that IR radiation from the IR radiation source 5 can reach the detector 14 through the coating area 12 and the windows 3 and 4. This optional IR radiation source 5 is also shown in the embodiment according to FIG. 1. If the IR radiation source 5 is attached to or in the area of the opposite chamber wall 11, as can be seen in FIG. 1, an optical element 10 is preferably also provided between the IR radiation source 5 and the coating area 12, by means of which the IR radiation 13*b* emitted by the IR radiation source 5 is specifically transported to the coating area 12. At the same time, this optical element 10 should be made of a material with the lowest possible thermal conductivity, for example quartz glass. An additional heater 8*a* can be provided at the end of the optical element 11 facing the coating area 12 to heat this end, as also shown in FIG. 1.

A particularly preferred example with such an additional IR radiation source 5 according to FIG. 1 is described in more detail below:

The radiation source 5 according to the preferred example should, for example, generate short-wave radiation 13*b* for detection. For this purpose, for example, a tungsten filament with a temperature range of 1,000° C.-1,800° C. and a maximum radiation energy<2 μm can be provided. This radiation 13*b* is guided out of the coating area 12 by the quartz rod 10 with a preferably frosted surface, preferably without expansion between the substrates 2 in the direction of window 3 and further window 4. The quartz rod 10 can preferably have a diameter of approximately a-3a, where a corresponds to the diameter of the opening of the connecting element 7. The distance between the lower end of the quartz rod 10 and the surfaces of the substrates is typically in the interval a-5a.

The radiation 13*b* can be measured at the same location as the radiation 13*a*, behind the chamber wall 11 outside the vacuum area. Here, a pyrometer with the corresponding spectral range can also be used, e.g., PYROSPOT DGE 44N with a spectral range of 2.0 to 2.6 μm (available from DIAS Infrared GmbH), Sirius SI23 with a spectral range of 2.0 to 2.6 μm (available from Sensortherm GmbH), IGA 320/23-LO with a spectral range of 2.0 to 2.6 μm (available from Advanced Energy), etc.

In addition, the surface of the quartz rod facing the substrate can be heated laterally up to approx. 700° C. (with the corresponding energy maximum at approx. 3 μm and >2 μm or >2.6 μm) by means of a heater 8*a*. In a vacuum and under corrosive vapors, a CFC heater can be used for this purpose.

The IR radiation emitted by the IR radiation source 5 can also be measured directly with the typical detectors using a radiation filter 6. The minimum normalized signal will correspond to the hot substrate, the maximum signal will correspond to the radiation 13*b* at a substrate-to-substrate distance>a. These two values can also be processed digitally in the two extreme ranges, including the adjustment of the transmission of the coated window 3 depending on the operating time. The substrate-to-substrate distances<a will also be in the other defined intermediate ranges. In absolute terms, the signal of a distance between the substrates is above the signal from the substrates and therefore corresponds to a positive signal.

As already explained at the beginning, the distance measurement according to the invention also works in the case that the substrates are colder than the environment of the coating chamber. However, if this difference is too small, an additional IR radiation source can also be provided in the coating chamber in this case, which is arranged in such a way that IR radiation from the IR radiation source 8*b* (see FIG. 2) can impinge on the detector 14 through the coating area 12 and the windows 3 and 4 of the gas-tight unit. In this case, the IR radiation source is preferably an IR spot heating source.

A particularly preferred example of this variant as shown in FIG. 2 is described below.

FIG. 2 shows a typical design of the coating chamber 1 according to the invention for a case of coating with CdS—CdTe/CdSe/CdSe. Here, the lower substrate side of the substrates 2 coated with CdS/CdSe/CdTe/TCO (Transparent Conductive Oxide) radiates either much less or slightly less heat than the hot environment in the coating area. Thus, a positive measurement signal is again expected in the gap or from the area between two adjacent substrates. If the environment of the coating chamber 1 cannot provide enough energy for the difference between min/max signals, a small heating source 8*b* with temperatures of up to 1,000° C. can also be installed locally in the spectral range 2-5 μm. The intensity of this heat source 8*b* can be compensated for depending on the transmission loss through the coating over the window 3—this can be taken into account in the automatic signal normalization process, e.g., by scheduling calibration steps between maintenance dates (window change) during system operation.

In the preferred embodiments described above, the minimum distance between the substrates suitable for measurement can be determined by the size of the opening in the connecting element 7, by the distance between the window 3 and the substrates 2 and by the minimum relative signal difference in radiation intensity measurable by a radiation detector. Accordingly, it is advantageous to manufacture the connecting element 7 in several versions with different diameters for replacement, e.g., with diameters of 5 mm, 8 mm, 10 mm, 15 mm, etc. Similarly, the tube 9 can be stocked for the distances a, 2a, 3a etc. for the commissioning phase with the coating material to adjust the signal intensity in order to implement an ideal configuration for a specific coating plant.

The invention claimed is:

1. A coating chamber for coating substrates the coating chamber comprising at least a first chamber wall and a coating region through which successive substrates to be coated are conveyed, the first chamber wall comprising a gas-tight unit comprising a first window for IR radiation and a second window for IR radiation, wherein the first window of the gas-tight unit closes the first chamber wall in a vacuum-tight manner, the second window of the gas-tight unit is arranged within the coating chamber between the coating region and the first window, and the first and second windows are connected to one another via a tubular element, the interior of which is separated from the coating chamber in a gas-tight manner, wherein the coating chamber further comprises a detector for IR radiation which is arranged such that IR radiation from the coating region can impinge on the detector through the first and/or second windows of the gas-tight unit, wherein the coating chamber further comprises a processor which is adapted and configured to determine the distance between two successive substrates to be coated on the basis of the IR radiation detected by the detector.

2. The coating chamber according to claim 1, wherein the tubular element consists of a material whose thermal conductivity is at most 50 W/m·K.

3. The coating chamber according to claim 1, wherein the tubular element has a mean reflection coefficient of at most 50% over the wavelength range from 0.3 µm to 6.0 µm on its inner side.

4. The coating chamber according to claim 1, wherein the successive substrates define a plane, wherein the first and second windows define an optical axis and wherein the optical axis forms an angle of between 80° and 100° with this plane.

5. The coating chamber according to claim 1, wherein the first window and/or the second window has a mean transmission of at least 10% over the wavelength range from 0.3 µm to 5.0 µm.

6. The coating chamber according to claim 1, wherein the coating chamber comprises an IR radiation source, which is arranged such that IR radiation from the IR radiation source can impinge on the detector through the coating region and through the first and/or second windows of the gas-tight unit.

7. The coating chamber according to claim 6, further comprising an IR radiation filter between the first window and the detector, wherein the IR radiation filter has a maximum transmission for the wavelength corresponding to the emission peak of the IR radiation source.

8. The coating chamber according to claim 1, wherein the coating chamber further comprises a second chamber wall opposite the first chamber wall, which comprises an IR radiation source arranged such that IR radiation from the IR radiation source can impinge on the detector through the coating region and through the first and/or second windows of the gas-tight unit.

9. The coating chamber according to claim 8, further comprising an optical element between the IR radiation source and the coating region.

10. The coating chamber according to claim 9, wherein the optical element has a transmission of at least 10% for the maximum of the IR radiation emitted by the IR radiation source.

11. The coating chamber according to claim 9, further comprising a heater for heating the end of the optical element facing the coating region.

12. A method for coating substrates using a coating chamber according to claim 1, wherein the method comprises:

conveying successive substrates to be coated through the coating region of the coating chamber and coating the successive substrates;

detecting the IR radiation incident on the detector; and determining the distance between two successive substrates to be coated on the basis of the detected IR radiation.

13. The method according to claim 12, wherein the method further comprises: calibrating the amount of IR radiation incident on the detector to a state in which only IR radiation emitted from a substrate is detected.

14. The method according to claim 12, wherein the method further comprises: calibrating the amount of IR radiation incident on the detector to a state in which no IR radiation emitted from a substrate is detected.

15. The method according to claim 12, wherein the method further comprises: calibrating the amount of IR radiation incident on the detector to one or more states in which two successive substrates have one or more well-defined distances.

16. The method according to claim 12, wherein the substrates emit IR radiation with an intensity maximum at a first wavelength and the first window and/or the second window having a transmission of at least 10% at the first wavelength.

17. The method according to claim 12, wherein the substrates emit IR radiation with an intensity maximum at a first wavelength, wherein the coating chamber detector, wherein the IR radiation filter has a maximum transmission for the first wavelength.

18. A coating chamber for coating substrates the coating chamber comprising at least a first chamber wall and a coating region through which successive substrates to be coated are conveyed, the first chamber wall comprising a gas-tight unit comprising a first window for IR radiation and a second window for IR radiation, wherein the coating chamber further comprises a detector for IR radiation which is arranged such that IR radiation from the coating region can impinge on the detector through the windows of the gas-tight unit, wherein the coating chamber further comprises a processor which is adapted and configured to determine the distance between two successive substrates to be coated on the basis of the IR radiation detected by the detector, wherein the coating chamber further comprises a second chamber wall opposite the first chamber wall, which comprises an IR radiation source arranged such that IR radiation from the IR radiation source can impinge on the detector through the coating region and through the first and/or second windows of the gas-tight unit, wherein the coating chamber further comprises an optical element between the IR radiation source and the coating region, wherein the optical element consists of a material the thermal conductivity of which is at most 10 W/m·K.

19. The coating chamber according to claim 18, wherein the first window of the gas-tight unit closes the first chamber wall in a vacuum-tight manner and wherein the second window of the gas-tight unit is arranged within the coating chamber between the coating region and the first window.

20. A method for coating substrates using a coating chamber according to claim 18, wherein the method comprises:

conveying successive substrates to be coated through the coating region of the coating chamber and coating the successive substrates;

detecting the IR radiation incident on the detector; and determining the distance between two successive substrates to be coated on the basis of the detected IR radiation.

21. A coating chamber for coating substrates the coating chamber comprising at least a first chamber wall and a coating region through which successive substrates to be coated are conveyed, the first chamber wall comprising a gas-tight unit comprising a first window for IR radiation and a second window for IR radiation, wherein the first window of the gas-tight unit closes the first chamber wall in a vacuum-tight manner and the second window of the gas-tight unit is arranged within the coating chamber between the coating region and the first window, wherein the coating chamber further comprises a detector for IR radiation which is arranged such that IR radiation from the coating region can impinge on the detector through the first and/or second windows of the gas-tight unit, wherein the coating chamber further comprises a processor which is adapted and configured to determine the distance between two successive substrates to be coated on the basis of the IR radiation detected by the detector, wherein the successive substrates define a plane, wherein the second window comprises a free opening area to which an inner diameter can be inscribed, and wherein the distance between the second window and the plane is at most five times the inner diameter.

* * * * *